United States Patent [19]
Sim

[11] Patent Number: 5,915,189
[45] Date of Patent: Jun. 22, 1999

[54] MANUFACTURING METHOD FOR SEMICONDUCTOR MEMORY DEVICE HAVING A STORAGE NODE WITH SURFACE IRREGULARITIES

[75] Inventor: Sang-pil Sim, Suwon, Rep. of Korea

[73] Assignee: Samsung Electronics Co., Ltd., Suwon-city, Rep. of Korea

[21] Appl. No.: 08/918,619

[22] Filed: Aug. 22, 1997

[51] Int. Cl.⁶ .................... H01L 21/8242; H01L 27/00
[52] U.S. Cl. ............................. 438/397; 257/306
[58] Field of Search ................... 257/321, 298, 257/306; 438/398, 255, 396, 259, 591, 389

[56] References Cited

U.S. PATENT DOCUMENTS

| | | | |
|---|---|---|---|
| 5,234,857 | 8/1993 | Kim et al. | 438/389 |
| 5,278,091 | 1/1994 | Fazan et al. | 438/398 |
| 5,340,763 | 8/1994 | Dennison | 438/396 |
| 5,381,365 | 1/1995 | Ajika et al. | 365/149 |

OTHER PUBLICATIONS

"Hemispherical Grained Si Formation on in–situ Phosphorous Doped Amorphous–Si Electrode for 256Mb DRAM's Capacitor," by Hirohito Watanabe et al., IEEE Transactions on Electron Devices, vol. 42, No. 7, Jul. 1995, pp. 1247–1254.

Primary Examiner—Olik Chaudhuri
Assistant Examiner—William David Coleman
Attorney, Agent, or Firm—Marger Johnson McCollom, P.C.

[57] ABSTRACT

A method for forming a storage electrode having increased area in a highly-integrated semiconductor device. In the method, a trench is formed in a thick insulating interlayer deposited on a semiconductor substrate. Hemispherical grains are formed on the surface of the trench to increase the surface area of the trench. A conductive layer for forming a storage electrode is formed in the surface of the trench. The conductive layer is patterned with a CMP process or etch back process to form a storage electrode. Forming a capacitor dielectric film over the electrode and a plate electrode over the film completes the process.

8 Claims, 5 Drawing Sheets

MANUFACTURING METHOD FOR SEMICONDUCTOR MEMORY DEVICE HAVING A STORAGE NODE WITH SURFACE IRREGULARITIES

BACKGROUND OF THE INVENTION

1. Field of the Invention

The present invention relates to the field of microelectronics, and more particularly, to a method of manufacturing a semiconductor memory device having a storage node with a rugged surface.

2. Description of the Related Art

In general, the capacity of semiconductor memory devices, and more particularly DRAM (Dynamic Random Access Memory) devices, is increasing due to the decrease in unit cell area. Capacity of a memory cell capacitor must be maintained to prevent deterioration of operating characteristics of the memory device. Providing sufficient capacity to work in the decreased memory cell area is a problem. The structure of a memory cell capacitor has evolved to a three dimensional structure from a two dimensional structure to provide sufficient capacitor area. Stack capacitors, Double Stack capacitors, FIN structures, Spread Stack capacitors, Box structures, and Cylinder electrode structures (U.S. Pat. No. 5,381,365) are suggested for increasing the memory cell capacitor area. These capacitor structures, however, are complicated to manufacture. U.S. Pat. No. 5,278,091 discloses a method of manufacturing of a Cylinder capacitor using HSG (Hemi-Spherical Grain) technology. Furthermore, for increasing the effective area of the capacitor, an advanced HSG technology is disclosed in "Hemispherical Grained Si Formation on in-situ Phosphorus Doped Amorphous-Si Electrode for 256 Mb DRAM's Capacitor", IEEE Vol. 42, July 95, by Hirohito Watanabe. The conventional art for manufacturing a capacitor using an HSG silicon layer process will now be described briefly referring to FIG. 1 through FIG. 3.

FIG. 1 and FIG. 2 are vertical sectional views showing examples of capacitors made using a conventional HSG silicon layer manufacturing process.

Referring to FIG. 1, transistor (not shown) and insulating interlayer 12 are formed on a semiconductor substrate 10. A conductive layer 14 for a storage electrode is formed on insulating interlayer 12 and is connected to the source of the transistor at the lower end thereof. The conductive layer for a storage electrode can be formed in cylindrical shape for increasing the surface area. Methods of forming a cylindrical shaped storage electrode are well known. Over the resulting structure, blanket HSG 16 is formed in the usual manner. This blanket HSG is formed on all surface including insulating interlayer 12 and conductive layer 14.

Referring to FIG. 2, prevention short circuits among adjacent cell capacitors formed by HSG silicon layer 16 requires additional processing. An insulating layer covers the cylinder electrode and is etched using an anisotropic etching method thus forming spacers, like spacer 18, inside and outside of the cylinder. Thereafter, the HSG silicon layer formed between adjacent cells is etched using the spacer 18 as etch mask. After the spacer is removed, a method of formation of a cylindrical shaped electrode with HSG is completed.

However, as the semiconductor device becomes highly integrated and the distance between adjacent cells becomes shorter, it is hard to form a spacer outside of cylinder capacitor. For example, on a 256 M DRAM level having a cell pitch under 0.4 $\mu$m, the distance between adjacent cylinders is under 0.2 $\mu$m. In this case, it is hard to form the spacer after HSG silicon layer is formed as shown in the dotted circle of FIG. 2.

FIG. 3 is a schematic view of another example of structure formed using a conventional HSG silicon layer process.

Referring to FIG. 3, an insulating layer 22 and a conductive layer 24, which is formed a storage electrode, are formed on the semiconductor substrate 20. Then, a selective HSG silicon layer is formed on only the conductive layer 24. Because the selective HSG silicon layer is not formed on insulating layer, but is formed on the conductive layer with poly crystalline silicon under high vacuum and appropriate temperature condition. In this manner, the process step to prevent short circuits among adjacent cells can be eliminated. However, when the distance between adjacent cells decreases, the HSG forming selectivity is worse and short circuits can occur. This selectivity problem is severe when silicon nitride film is layered under the storage electrode.

SUMMARY OF THE INVENTION

The present invention provides a manufacturing method for a semiconductor memory device having a storage node with increased surface area without short circuits among adjacent cells.

According to the present invention, first, a first insulating interlayer is formed on a semiconductor substrate. Substrate as used herein includes a surface formed on a semiconductor device during processing, as shown in the embodiments of FIGS. 4–11. A contact hole exposing a portion of the semiconductor substrate is formed on the first insulating interlayer. A conductive plug connecting to the semiconductor substrate is formed in the contact hole. Over the resultant structure, a second insulating layer is formed. A trench is formed on a region where a storage electrode will be formed exposing a portion of underlying structure. Then, an HSG silicon layer is formed on the surface of the trench. The trench surface of the insulating layer is etched using an isotropic etching technique, such as a wet chemical etch, and is masked by the HSG silicon layer. A surface irregularities are thus formed on the second insulating interlayer inside the trench.

Alternatively, an isotropic etching method having a selectivity substantially equal to the insulating interlayer and the HSG layer can be used for forming the surface irregularities. A conductivity layer is formed on the surface of the sidewall and bottom of the trench. A CMP (Chemical Mechanical Polishing) process is performed to expose the second insulating interlayer. A storage electrode having surface irregularities reflected from the trench surface is thus formed after removing insulating layer. A dielectric film and a plate electrode are sequentially formed on the storage electrode to complete the manufacturing process of the semiconductor memory cell capacitor electrode having surface irregularities.

In other method for manufacturing a semiconductor memory device of the present invention, a trench is formed as in the first embodiment. A thin silicon nitride layer having pinholes is formed on the surface of the trench. A heat treatment can be performed to provide a uniform pinhole density on the thin silicon nitride. The trench surface of the insulating layer is etched through the pinholes in the silicon nitride layer which acts as an etch mask. After that, the silicon nitride layer is removed. Then, a storage electrode and capacitor dielectric film are formed on the trench surface as in the first embodiment.

According to the present invention, a trench is formed in a thick insulating interlayer on a semiconductor substrate. Surface irregularities are then formed on the surface of the trench to increase the surface area of the trench. The irregularities are reflected to a conductive layer which defines a storage electrode. In this method, the surface irregularities thus formed on the storage electrode increases the surface area of the storage electrode. Also, short circuits between adjacent storage electrodes are reduced effectively.

BRIEF DESCRIPTION OF THE DRAWINGS

The above object, features and advantages of the present invention will become more apparent by describing in detail preferred embodiments thereof with reference to the attached drawings in which.

DESCRIPTION OF THE PREFERRED EMBODIMENTS

The present invention will now be described more fully hereinafter with reference to the accompanying drawings, in which preferred embodiments of the invention are shown. This invention will be described in detail with COB (Capacitor Over Bit-line) structure, however, this invention can be implemented with other structures.

Embodiment

FIGS. 4 through 8 are sectional views sequentially showing a process of manufacturing a capacitor electrode having rugged surface according to a first embodiment of the present invention.

Figure 1:
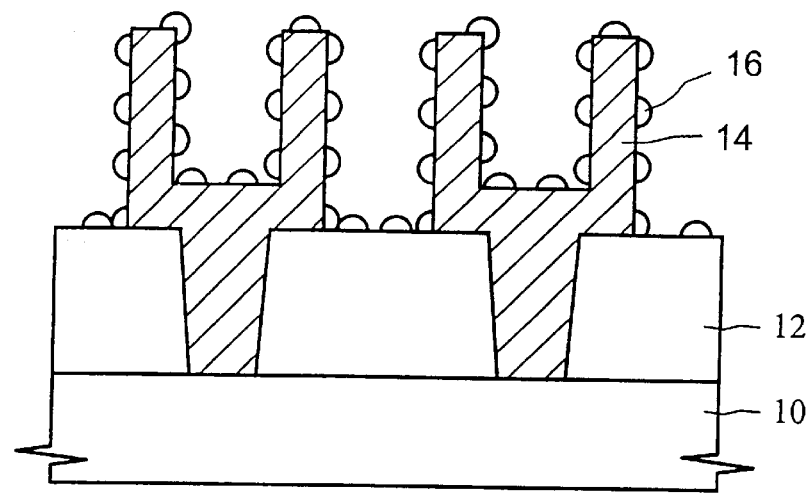
FIGS. 1 and 2 are sectional views showing a conventional method for manufacturing a capacitor using an HSG silicon layer process.
Figure 2:
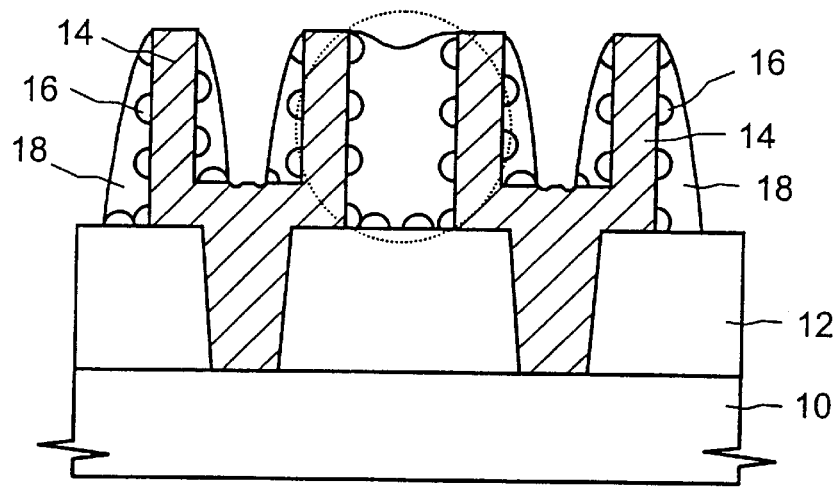
Figure 3:
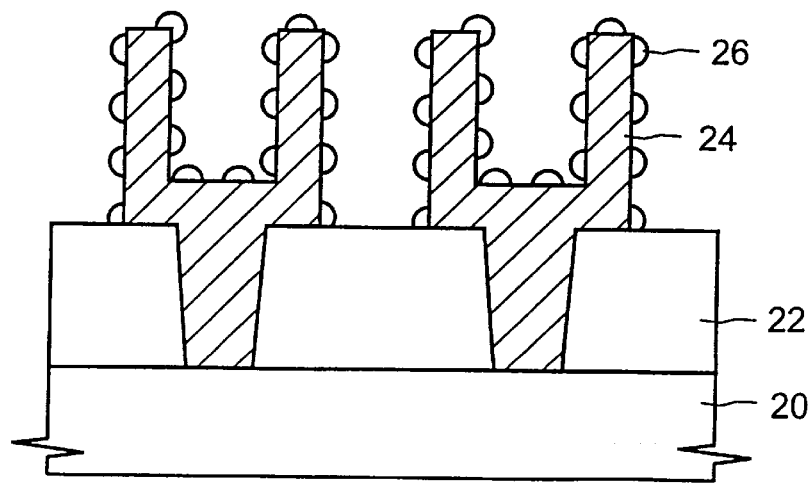
FIG. 3 is sectional view showing another conventional method for manufacturing a capacitor using an HSG silicon layer process.
Figure 4:
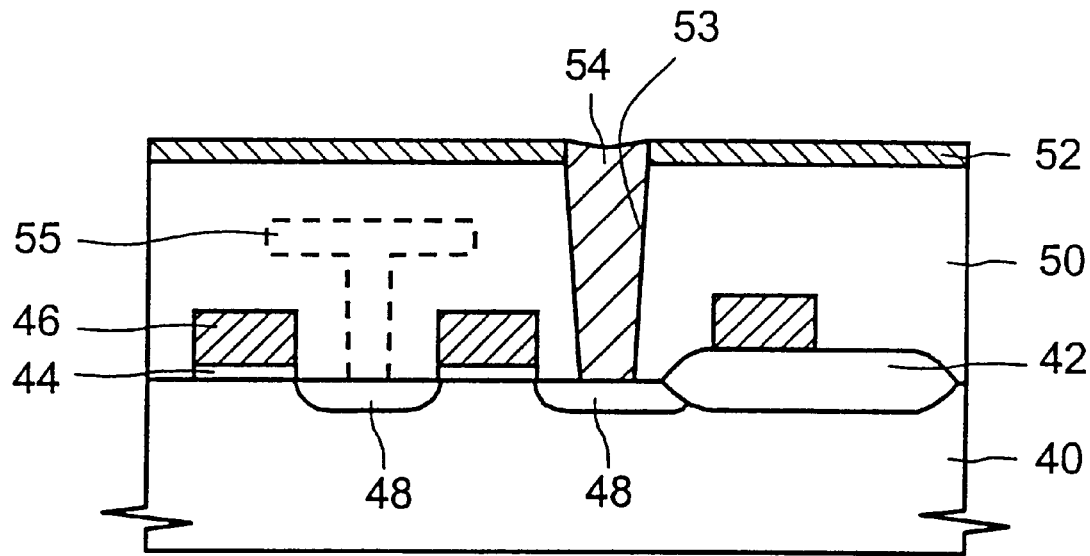
FIGS. 4 through 8 are sectional views sequentially illustrating a process of manufacturing a capacitor according to a first embodiment of the present invention.

FIG. 4 illustrates process steps of forming an insulating interlayer and a contact hole. A field oxide 42 is formed on a silicon substrate 40 for defining an active region and a field region on the substrate. A transistor having a gate electrode 46, a gate insulation layer 44, and a source/drain 48 is formed on the active region of silicon substrate 40. When using COB structure process, a bit-line 55 is formed to connect to the source/drain 48 of the transistor. A first insulating interlayer 50, such as a silicon dioxide film, is formed on the resulting structure. An etch mask layer 52, such as silicon nitride, is then formed on the first insulating interlayer 50. A contact hole 53 is formed using photolithography process to expose source region 48. Subsequently, a doped poly silicon layer is deposited and etched back on the resultant structure for forming a plug 54 which fills the contact hole. The thickness of the deposition and etching of the doped poly silicon layer depends on the width of the contact hole. Also, when the contact hole 53 is shallow or narrow enough to be filled with a conductive layer which will be formed as a storage electrode later, this doped poly silicon layer process can be eliminated.

Figure 5:
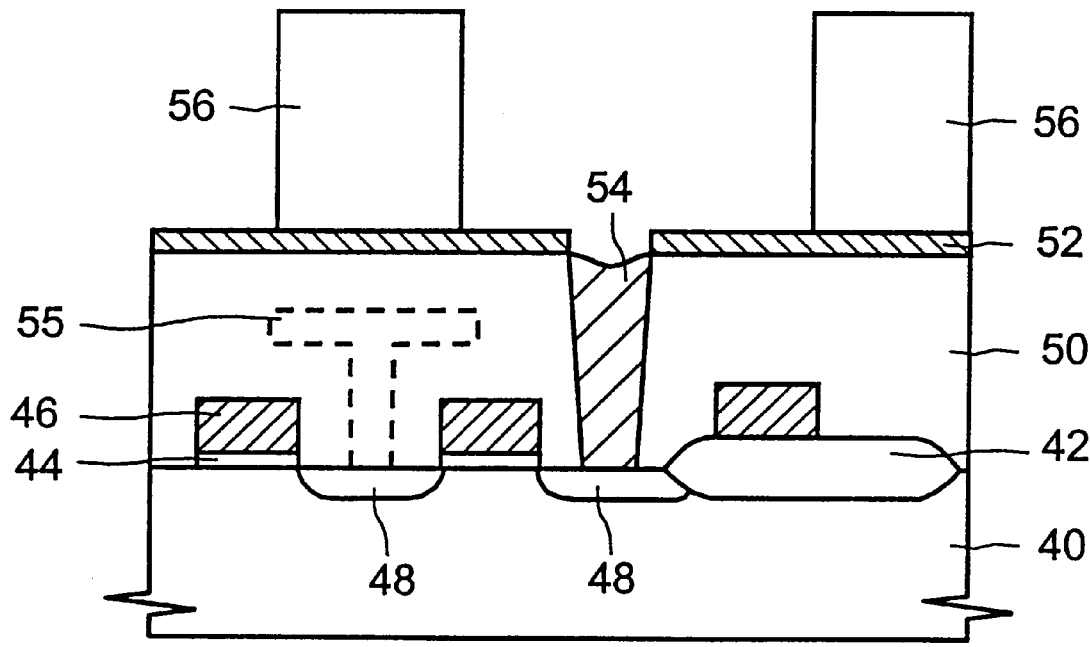

Referring to FIG. 5, after the plug 54 is formed, a second insulating interlayer 56, such as silicon glass, is formed on the resultant structure. The thickness of the second insulating interlayer 56 can be in the range of 1500~10000 Å. The height of the storage electrode will be defined by the thickness of the second insulating interlayer 56. After that, the second insulating interlayer 56 is etched using known photolithography process to expose the plug 54 and a region in which a storage electrode will be formed. The second insulating interlayer 56 must be etched until the plug is exposed or until the source/drain 48 (at the bottom of contact hole 53) of the transistor is exposed in the case when the plug is not yet formed. A trench of insulating interlayer is thus formed as a pattern for a storage electrode.

Figure 6:
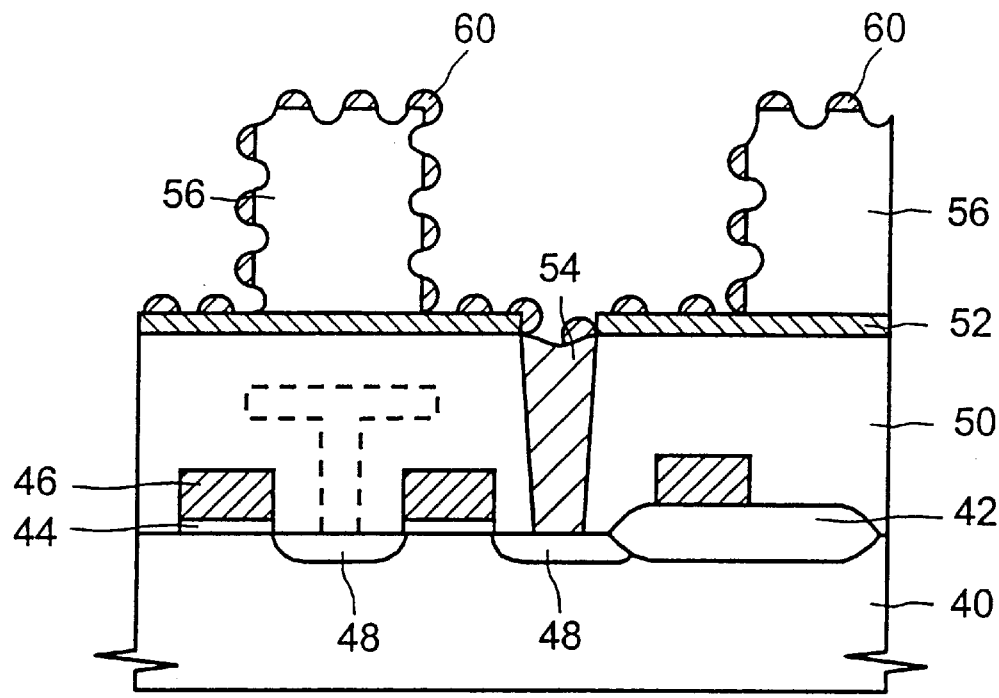

Referring to FIG. 6, after the trench is formed, a blanket HSG 60 layer is formed on the resultant structure. Then, the second insulating interlayer 56, such as silicon glass, is etched slightly with the blanket HSG as an etch mask. The second insulating layer 56, such as silicon glass, can be etched 100~1000 Å by diluted hydrofluoric acid within 10~800 seconds. When the second insulating interlayer is etched, any isotropic etching method which has good etching selectivity can be used. The second insulating interlayer 56 can be etched until a tiny undercut (not shown in figure) is formed under HSG layer 60. This forms pits having a depth of several hundred Å on the trench sidewall as shown in FIG. 6. The etch mask layer 52, such a silicon nitride film, is not etched by the hydrofluoric acid during this step.

Figure 7:
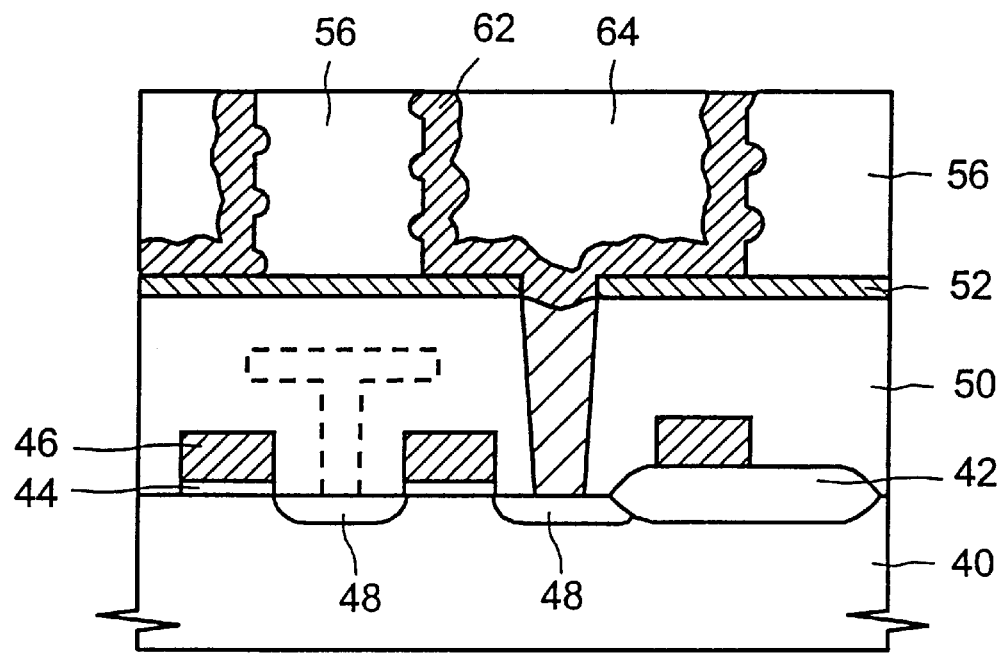

Referring to FIG. 7, after the blanket HSG layer is removed, a conductive layer 62, such as a doped poly silicon layer, is formed to create a storage electrode. The conductive layer 62 can be formed as cylindrical shape or can fill the trench depending on the thickness of the conductive layer 62. A CMP (Chemical Mechanical Polishing) process is then performed on the resultant structure until the second insulating interlayer 56 is exposed. Before the CMP process is performed, it is preferable to form a third insulating layer 64 on the conductive layer 62 to fill the trench. Some slurry can remain inside of the trench after the CMP process is performed if the trench is not completely filled. Alternatively, the third insulating interlayer can be etched back instead of performing the CMP process. The third insulating interlayer is deposited and etched back until a portion of the third insulating interlayer inside the trench remains. The conductive layer 62 is then etched back using the third insulating interlayer 64 as an etch mask. A storage electrode is thus formed in cylindrical shape. The second insulating interlayer 56 and the third insulating interlayer 64 are removed after the CMP process or etch back process is performed.

Figure 8:
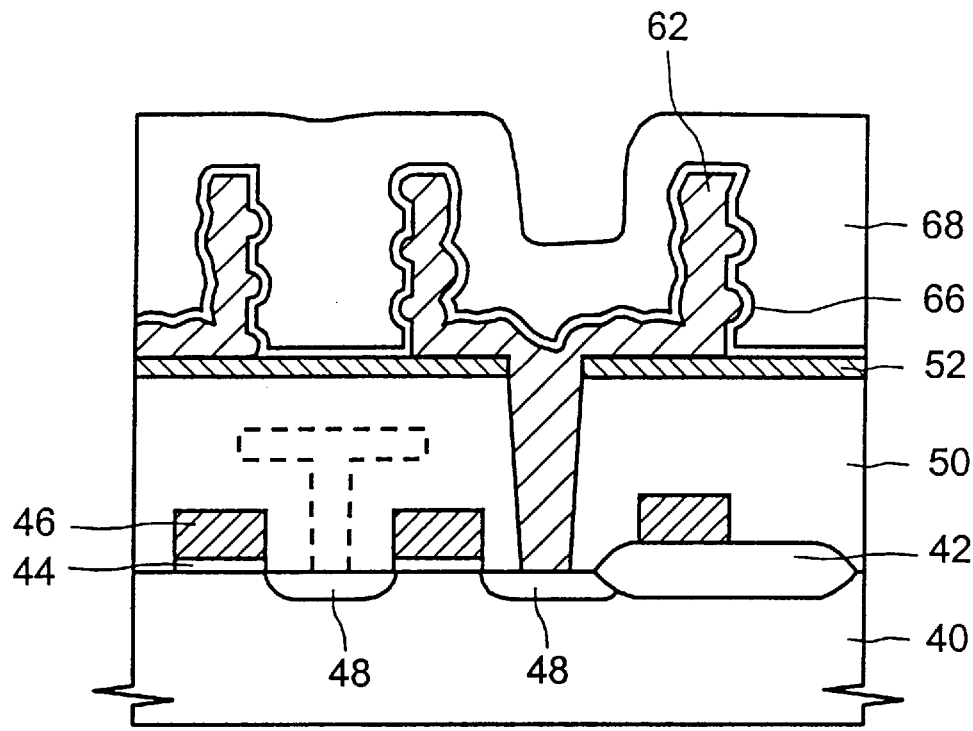

Thereafter, as shown in FIG. 8, a capacitor dielectric film 66 and a cell plate electrode 68 are formed on the resultant structure. A manufacturing process of a semiconductor memory cell capacitor electrode having a rugged surface is thus completed.

According to the first embodiment of the present invention, the surface of the storage electrode can be increased effectively and a short circuit between adjacent cells can be prevented.

Figure 9:
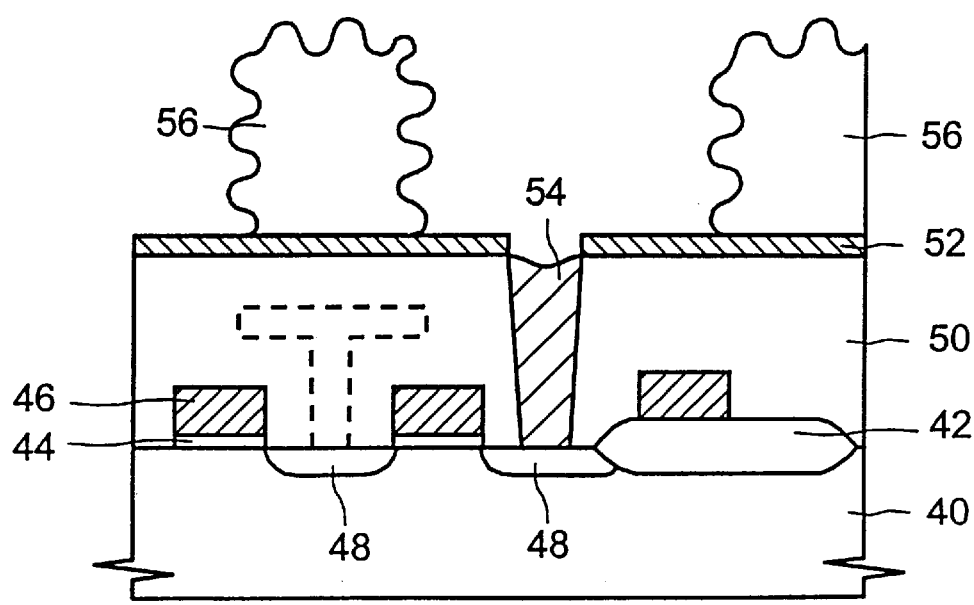
FIG. 9 is a sectional view illustrating a process of manufacturing a capacitor according to a second embodiment of the present invention.

FIG. 9 is a sectional view showing a manufacturing process of a capacitor electrode according to a second embodiment of the present invention.

Referring to FIG. 9, a trench and blanket HSG can be formed as in the first embodiment. After forming a trench and a blanket HSG layer, the insulating interlayer is etched at a rate approximately same as that of the HSG. The surface of the trench, i.e., the HSG layer and the second insulating interlayer 56, are etched until the HSG layer is entirely removed. A rugged surface of the trench is thus formed as shown in FIG. 9. After a conductive layer for a storage electrode is formed and the second insulating interlayer 56 is eliminated on the same as in the first embodiment, a storage cell capacitor electrode can be formed. A dielectric film and cell plate electrode is formed on the resultant structure. A semiconductor cell capacitor is thus completed.

According to the second embodiment of the present invention, the HSG layer formed on the surface of the trench does not remain. A particle problem caused by the HSG silicon layer is therefore avoided.

Figure 10:
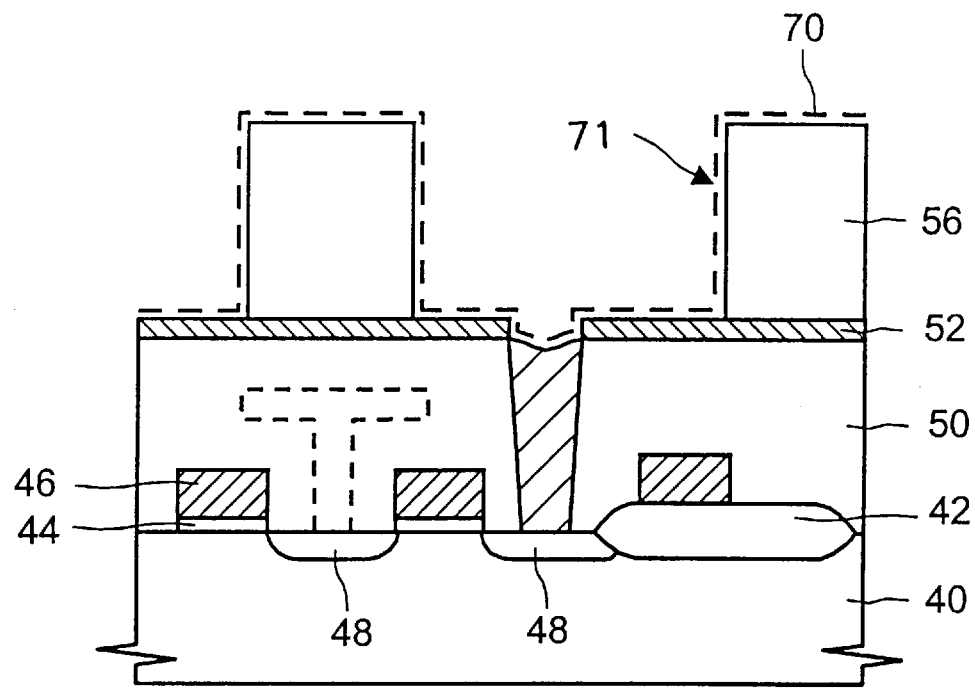
FIGS. 10 and 11 are sectional views illustrating a process of manufacturing a capacitor according to a third embodiment of the present invention.
Figure 11:
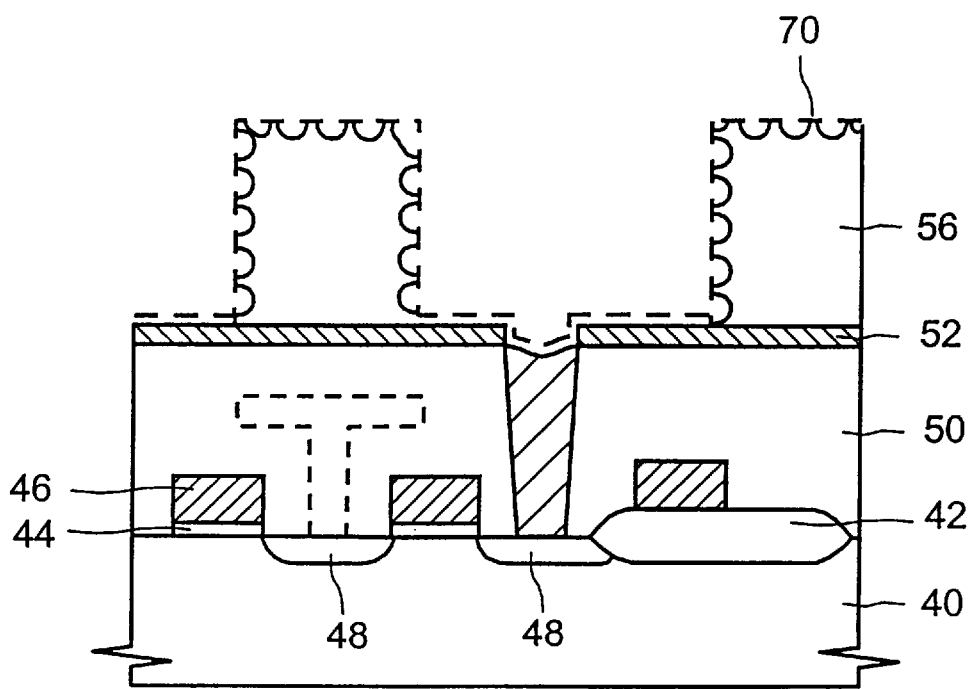

FIGS. 10 through 11 are sectional views sequentially showing a manufacturing process of a capacitor according to a third embodiment of the present invention.

Referring to FIG. 10, a trench is formed as in the first or second embodiments. A thin silicon nitride film 70, less than 100 Å, is formed on the surface of the resultant structure. Usually, there are many pinholes in the thin silicon nitride film 70. When good uniformity and reproducibility of the pinholes on the silicon nitride film 70 is needed, thermal treatment can be added after the silicon nitride layer is deposited.

Referring to FIG. 11, the second insulating interlayer 56 is etched through the pinholes, i.e., pits are formed on the surface of the trench as shown in FIG. 11. After that, the silicon nitride film 70 is removed. A storage electrode and a capacitor dielectric film is thus formed on the rugged surface of the trench in the same manner as the first or second embodiment.

The present invention is not limited embodiments in this description. This idea can be extended in various ways by a person skilled in the technology involved in this field.

According to the description of the present invention, a trench is formed in a thick insulating interlayer which is formed on a semiconductor substrate. Then, a ruggedness is formed on the surface of the trench to increase the surface area of the trench. A conductive layer for forming of storage electrode is formed on the surface of the resultant structure. The conductive layer is patterned with CMP process or etch back process for the purpose of forming a storage electrode. In this method, since a storage electrode is defined when a trench is formed and the ruggedness of the surface of the trench is reflected to the storage electrode, the surface area of the storage electrode can be increased effectively. Also, a short circuit phenomenon between adjacent storage electrode can be reduced effectively.

I claim:

1. A method for manufacturing a semiconductor memory device having a storage electrode with a rugged surface comprising:

a) forming an insulating layer on a semiconductor substrate;

b) removing the insulating layer over a first portion of the semiconductor substrate where a storage electrode will be formed and forming at least one upwardly extending insulating layer portion adjacent the first portion of the semiconductor substrate;

c) forming a plurality of surface irregularities on the first portion of said semiconductor substrate and on the at least one upwardly extending insulating layer portion;

d) forming a storage electrode covering the first portion of said semiconductor substrate and the at least one upwardly extending insulating layer portion;

e) removing the at least one upwardly extending insulating layer portion; and, f) forming a dielectric film and a plate electrode sequentially covering the storage electrode.

2. The method of claim 1, in which step a) comprises:

forming a transistor and a base insulating layer on said semiconductor substrate;

forming a contact hole exposing a portion of the semiconductor substrate; and forming a conductive plug in the contact hole.

3. The manufacturing method of claim 1, in which step c) comprises:

forming an HSG silicon layer on the at least one upwardly extending insulating layer portion; and etching the HSG and at least one upwardly extending insulating layer portion.

4. The method of claim 3, wherein the etching step is a wet etching technique.

5. The method of claim 1 wherein said method further comprises:

perform a chemical-mechanical polishing process on said storage electrode.

6. A method for manufacturing a semiconductor memory device having a storage electrode with a rugged surface comprising:

a) forming an insulating layer on a semiconductor substrate;

b) removing the insulating layer over a first portion of the semiconductor substrate where a storage electrode will be formed and forming at least one upwardly extending insulating layer portion adjacent the first portion of the semiconductor substrate;

c) forming a an HSG silicon layer on the first portion of said semiconductor substrate and on the at least one upwardly extending insulating layer portion, the HSG layer having a plurality of surface irregularities;

d) etching away the HSG silicon layer;

e) forming a storage electrode covering the first portion of said semiconductor substrate and the at least one upwardly extending insulating layer portion;

e) removing the at least one upwardly extending insulating layer portion; and, f) forming a dielectric film and a plate electrode sequentially covering the storage electrode.

7. The method of claim 1, in which step c) comprise:

forming a silicon nitride layer having pinholes on the at least one upwardly extending insulating layer portion;

etching the at least one upwardly extending insulating layer portion through said pinholes; and removing the silicon nitride layer.

8. A manufacturing method for the semiconductor memory device of claim 7, wherein said method further comprise heating the silicon nitride layer.

* * * * *